US011302543B2

(12) United States Patent
Kuwahara

(10) Patent No.: US 11,302,543 B2
(45) Date of Patent: Apr. 12, 2022

(54) SUBSTRATE CARRIER APPARATUS AND SUBSTRATE CARRYING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 30 days.

(21) Appl. No.: 17/005,447

(22) Filed: Aug. 28, 2020

(65) Prior Publication Data

US 2021/0090918 A1 Mar. 25, 2021

(30) Foreign Application Priority Data

Sep. 19, 2019 (JP) .............................. JP2019-170692

(51) Int. Cl.
*H01L 21/677* (2006.01)
*H01L 21/67* (2006.01)
(Continued)

(52) U.S. Cl.
CPC ........ *H01L 21/67265* (2013.01); *B65G 47/91* (2013.01); *G03F 7/70733* (2013.01);
(Continued)

(58) Field of Classification Search
None
See application file for complete search history.

(56) References Cited

U.S. PATENT DOCUMENTS 5,740,059 A * 4/1998 Hirata ............... H01L 21/67778
700/213
6,298,280 B1 * 10/2001 Bonora ................ H01L 21/681
414/941
(Continued)

FOREIGN PATENT DOCUMENTS

JP 2009-088222 A 4/2009
JP 2010-287783 A 12/2010
(Continued)

OTHER PUBLICATIONS

Office Action and Search Report dated Jul. 20, 2021 in corresponding Taiwanese Patent Application No. 109120008 with English translation based on attached Japanese translation. Portions relevant to prior-art based rejections are translated.
(Continued)

*Primary Examiner* — Gerald McClain
(74) *Attorney, Agent, or Firm* — Ostrolenk Faber LLP

(57) ABSTRACT

A substrate carrier apparatus includes a hand, an advancing/retracting mechanism, an elevation mechanism, a movement mechanism, and a detector. The advancing/retracting mechanism moves the hand in a forward and backward direction to cause the hand to enter and be retracted from a substrate container. The elevation mechanism elevates the hand so that the hand lifts a substrate from below. The movement mechanism moves the hand to a position facing the substrate container. The detector detects a position of the substrate in the forward and backward direction in an entry state where the advancing/retracting mechanism causes the hand to enter the substrate container, moves integrally with the hand, and is disposed at a position adjacent to the substrate in a measurement direction intersecting with the forward and backward direction.

6 Claims, 10 Drawing Sheets

FORWARD
D1
BACKWARD

(51) Int. Cl.
*H01L 21/687* (2006.01)
*G03F 7/20* (2006.01)
*B65G 47/91* (2006.01)

(52) U.S. Cl.
CPC .. *H01L 21/67766* (2013.01); *H01L 21/67778* (2013.01); *H01L 21/68707* (2013.01); *B65G 2203/0233* (2013.01)

(56) References Cited

U.S. PATENT DOCUMENTS

| | | | | |
|---|---|---|---|---|
| 8,820,809 | B2* | 9/2014 | Ando | H01L 21/67265 294/213 |
| 9,111,979 | B2* | 8/2015 | Fairbairn | H05K 13/0069 |
| 11,004,713 | B2* | 5/2021 | Houng | H01L 22/10 |
| 2005/0242305 | A1 | 11/2005 | Oka | |
| 2009/0087932 | A1 | 4/2009 | Kondoh | 438/30 |
| 2009/0093906 | A1* | 4/2009 | Takizawa | H01L 21/67265 700/214 |
| 2012/0290124 | A1* | 11/2012 | Kimura | H01L 21/67265 700/218 |
| 2013/0028687 | A1 | 1/2013 | Takahashi et al. | |
| 2015/0246447 | A1 | 9/2015 | Furuichi et al. | |
| 2016/0111312 | A1* | 4/2016 | Yoshida | H01L 21/67265 294/213 |
| 2017/0301540 | A1 | 10/2017 | Hashimoto et al. | |
| 2020/0411348 | A1* | 12/2020 | Yoshida | B25J 19/025 |

FOREIGN PATENT DOCUMENTS

| | | |
|---|---|---|
| JP | 2019-033220 A | 2/2019 |
| KR | 2005-0088150 A | 9/2005 |
| KR | 2013-0014406 A | 2/2013 |
| KR | 2019-0066545 A | 6/2019 |
| TW | 201247376 A | 12/2012 |
| TW | 201540444 A | 11/2015 |
| TW | 201624598 A | 7/2016 |

OTHER PUBLICATIONS

Office Action dated Dec. 29, 2021 in corresponding Taiwan Patent Application No. 109120008 and partial English translation based on the Japanese translation of the original communication.
Notification of Reason for Refusal dated Feb. 18, 2022 in corresponding Korean Patent Application No. 10-2020-0101004 and English translation obtained from Global Dossier.

* cited by examiner

FIG. 7
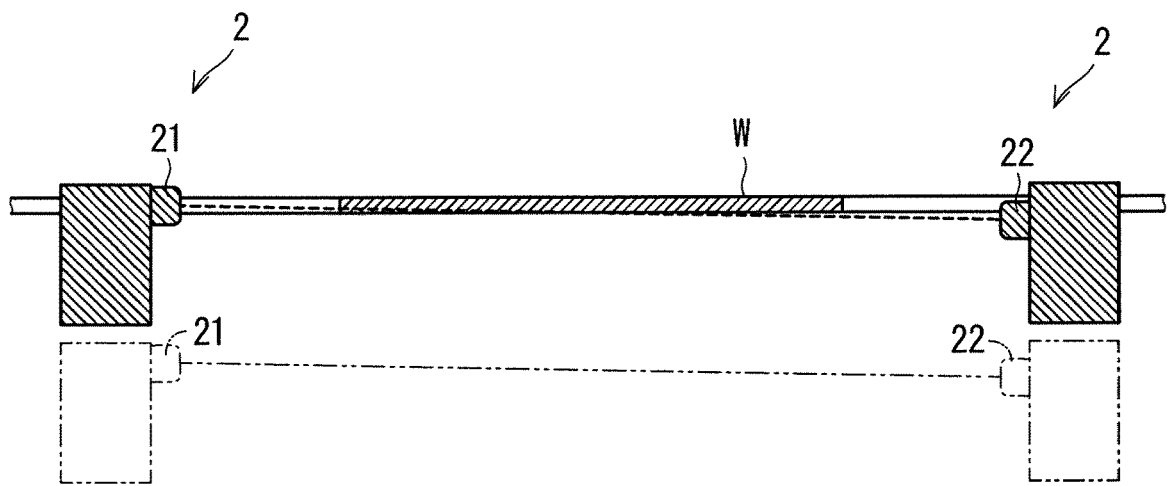
FIG. 8
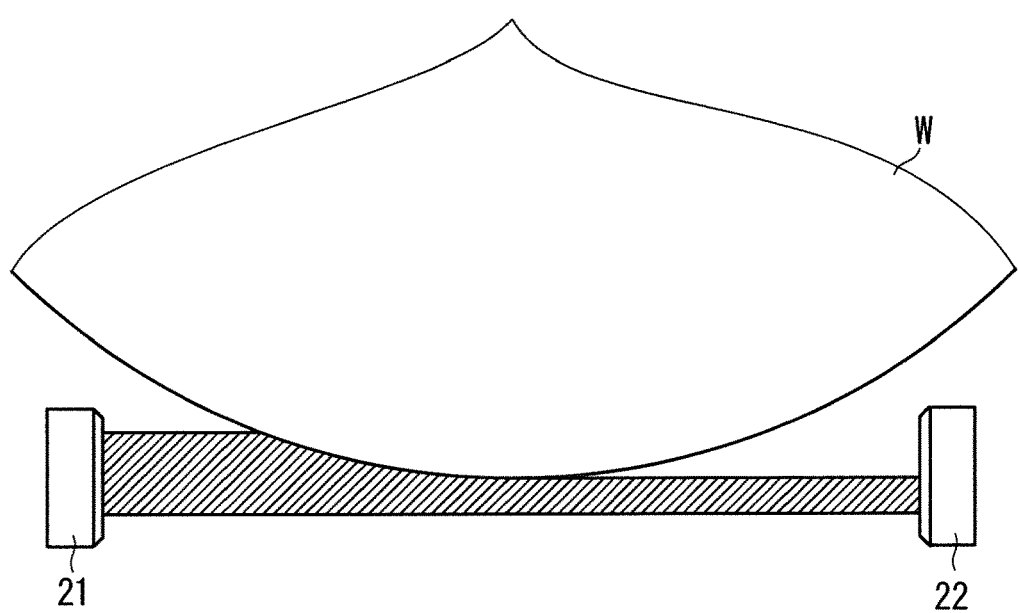
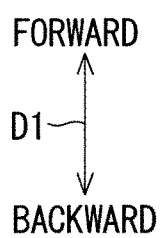

FIG. 9
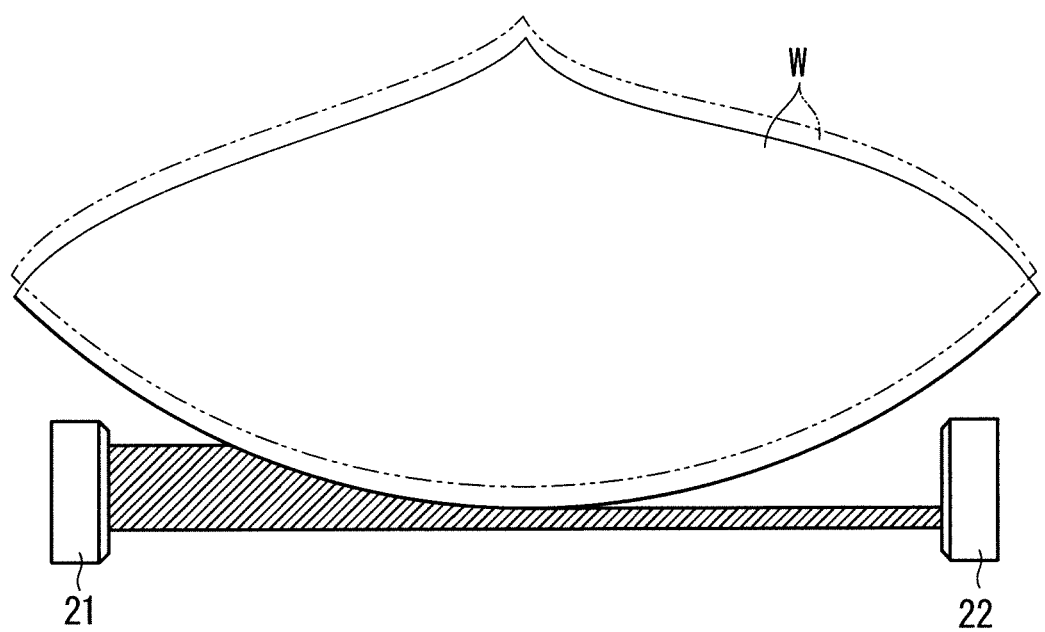
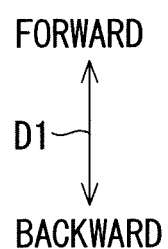

F I G. 1 1
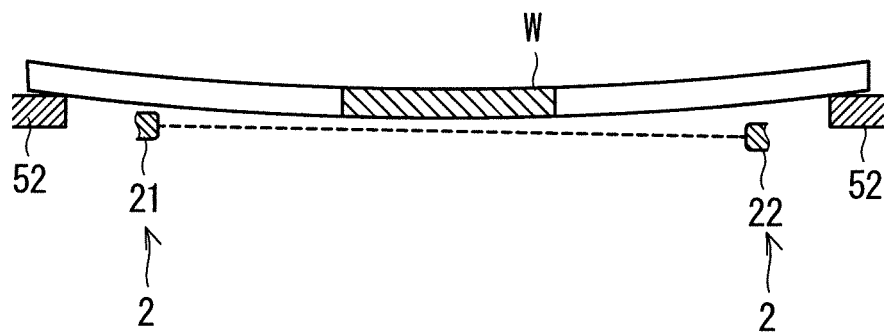

SUBSTRATE CARRIER APPARATUS AND SUBSTRATE CARRYING METHOD

BACKGROUND OF THE INVENTION

Field of the Invention

The present disclosure relates to a substrate carrier apparatus and a substrate carrying method.

Description of the Background Art

Substrate carrier apparatuses each of which removes a substrate from a cassette that houses substrates have conventionally been proposed (for example, Japanese Patent Application Laid-Open No. 2019-33220, Japanese Patent Application Laid-Open No. 2010-287783, and Japanese Patent Application Laid-Open No. 2009-88222). Such substrate carrier apparatus includes a hand on which a substrate is mounted. The substrate carrier apparatus removes the substrate from the cassette through the following operations. Specifically, the substrate carrier apparatus first adjusts the level of the hand in a position facing the cassette. More specifically, the substrate carrier apparatus adjusts the level of the hand so that the hand is slightly lower than the substrate to be removed. Then, the substrate carrier apparatus moves the hand inside the cassette in a forward and backward direction. The substrate carrier apparatus elevates the hand while stopping the hand in a predetermined position immediately below the substrate. Consequently, the hand can lift the substrate. Next, the substrate carrier apparatus retracts the hand from the cassette. Consequently, the substrate can be removed from the cassette.

However, the mounting position of the substrate may be displaced inside the cassette. Specifically, the mounting position of the substrate in the forward and backward direction may be displaced from a defined reference position. Once the substrate is displaced from the reference position, the relative position relationship between the hand and the substrate is also displaced. Consequently, the substrate is not mounted in an appropriate position on the hand. In other words, the hand can neither lift the substrate in the appropriate position nor appropriately remove the substrate.

SUMMARY

This disclosure is directed to a substrate carrier apparatus that removes a substrate from a substrate container and carries the substrate to a substrate holder, the substrate container having an inner structure for housing a plurality of substrates in a horizontal orientation with the plurality of substrates stacked in a vertical direction with spacings.

In one aspect of this disclosure, the substrate carrier apparatus includes a hand; an advancing/retracting mechanism that moves the hand in a forward and backward direction to cause the hand to enter and be retracted from the substrate container; an elevation mechanism that elevates the hand so that the hand lifts the substrate from below; a movement mechanism that moves the hand to a position facing the substrate container; and detectors that detect a position of the substrate in the forward and backward direction in an entry state where the advancing/retracting mechanism causes the hand to enter the substrate container, the detectors moving integrally with the hand and being disposed at positions adjacent to the substrate in a measurement direction intersecting with the forward and backward direction.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 schematically illustrates an example position relationship between the substrate and sensor;

FIG. 8 is a plan view schematically illustrating an example state where a part of light from a light emitter is cut off by the substrate;

FIG. 9 is a plan view schematically illustrating another example state where the part of the light from the light emitter is cut off by the substrate;

FIG. 11 schematically illustrates an example shape of the substrate housed in the substrate container;

DESCRIPTION OF THE PREFERRED EMBODIMENTS

Figure 1:
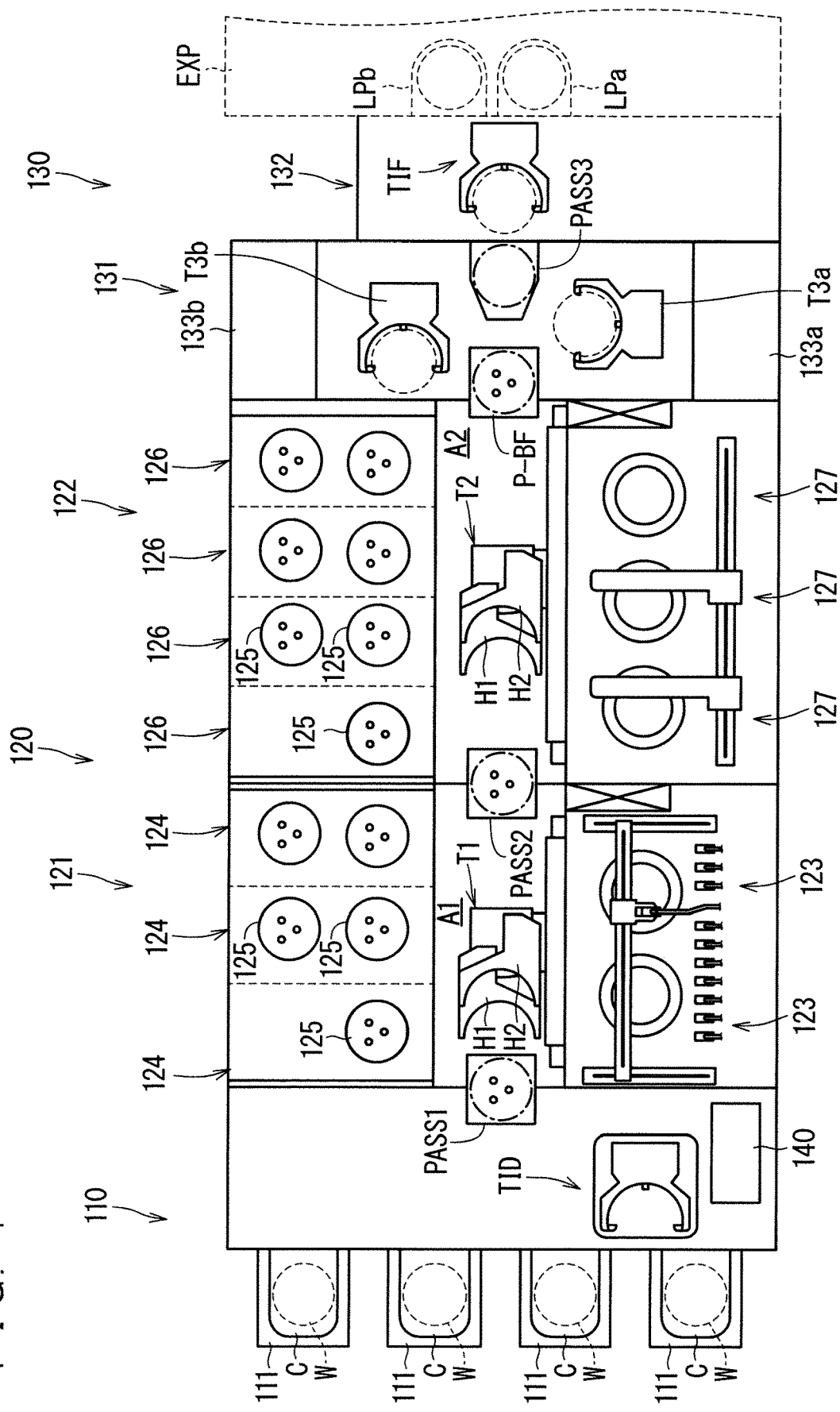
FIG. 1 schematically illustrates an example structure of a substrate processing apparatus.

Embodiments will be described with reference to the accompanying drawings. The drawings are schematically illustrated, and the structures are appropriately omitted or simplified for convenience of the description. Furthermore, the mutual relationships in size and position of the structures in the drawings are not necessarily accurate but may be changed when needed.

In the following description, the same reference numerals are assigned to the same constituent elements, and their names and functions are the same. Thus, the detailed description thereof may be omitted to avoid overlaps.

[Outline Structure of Substrate Processing Apparatus]

FIG. 1 is a plan view schematically illustrating an example structure of a substrate processing apparatus. The substrate processing apparatus in FIG. 1 is an apparatus that forms a resist film on a substrate (e.g., a semiconductor wafer) W and develops the substrate W that has been exposed to light.

In the example of FIG. 1, the substrate processing apparatus includes an indexer 110, a processing module 120, an interface 130, and a controller 140. The controller 140 controls various structures of the substrate processing apparatus.

The controller 140 is an electronic circuit, and may include, for example, a data processor and a storage medium. The data processor may be an arithmetic processor, for example, a central processor unit (CPU). The storage medium may include a non-transitory storage medium (e.g., a read-only memory (ROM) or a hard disk) and a transitory storage medium (e.g., a random access memory (RAM)). For example, a program for defining processes to be executed by the controller 140 may be stored in the non-transitory storage medium. The data processor executes this program, so that the controller 140 can execute the processes defined in the program. Obviously, the hardware may execute a part or the whole processes to be executed by the controller 140.

The indexer 110 and the interface 130 are disposed adjacent to the sides of the processing module 120. The interface 130 is further disposed adjacent to an exposure machine EXP that is a separate external apparatus from the substrate processing apparatus.

The indexer 110 includes a plurality of container mounting stages 111 (four in FIG. 1) and a carrier mechanism TID. The plurality of container mounting stages 111 are aligned in a column. One substrate container C is mounted on each of the container mounting stages 111.

The substrate container C may be, for example, a front opening unified pod (FOUP) that houses the substrates W in a closed state, a standard mechanical interface (SMIF) pod, or an open cassette (OC). In the substrate container C, a plurality of the substrates W in a horizontal orientation are stacked in a vertical direction with spacings. The horizontal orientation herein means a state where the thickness direction of the substrates W is equal to the vertical direction.

The carrier mechanism TID is horizontally movable on the side of the container mounting stages 111 in the alignment direction of the substrate containers C, and can stop in a position facing each of the substrate containers C. The carrier mechanism TID includes a holding arm which passes the substrate W between each of the substrate containers C and the processing module 120. The carrier mechanism TID removes the substrate W from the substrate container C and carries the substrate W into the processing module 120. The carrier mechanism TID also houses the substrate W received from the processing module 120 in the substrate container C.

The indexer 110 includes a mapping sensor (not illustrated) for detecting the presence or absence of a substrate in each row of the substrate container C. For example, the mapping sensor includes a light emitter and a light receiver. The light emitter and the light receiver are disposed to face each other in the alignment direction of the substrate containers C. The light emitter emits light to the light receiver, and the light receiver receives this light. The light emitter is integral with the light receiver. The light emitter and the light receiver are horizontally and vertically movable, and can enter the substrate containers C. Specifically, the light emitter and the light receiver enter the substrate container C to sandwich a part of the substrate W in a planar view. Suppose that the light emitter and the light receiver are placed as high as a certain row. If the substrate W is mounted on the row, the light from the light emitter is cut off by the substrate W. If not, the light receiver receives the light from the light emitter.

Conversely speaking, no reception of the light by the light receiver indicates that the substrate W is mounted on the row, and reception of the light by the light receiver indicates that the substrate W is not mounted on the row. Elevation of the light emitter and the light receiver from the lowest row to the highest row in the substrate container C enables detection of the presence or absence of the substrate in each of the rows in the substrate container C. The mapping sensor outputs a result of the detection to the controller 140. The controller 140 controls the carrier mechanism TID according to the result of the detection by the mapping sensor.

The processing module 120 performs a process on the substrate W. In the example of FIG. 1, the processing module 120 is divided into cells 121 and 122. The cell 121 includes a main carrier mechanism T1, and the cell 122 includes a main carrier mechanism T2. Each of the cells 121 and 122 includes a plurality of treatment units. Although the example of FIG. 1 illustrates only the cells 121 and 122, the processing module 120 may include a plurality of the cells 121 and 122 in the vertical direction. In other words, a cell identical to the cell 121 may be stacked on the cell 121, and a cell identical to the cell 122 may be stacked on the cell 122. Specifically, the processing module 120 may have a multi-layered structure. For example, a resist film is formed on the substrate W in the cell 121 (and the upper cell), and the substrate W is developed in the cell 122 (and the upper cell).

The cells 121 and 122 are aligned side by side in the horizontal direction and joined to each other to form one substrate processing lane which links the indexer 110 and the interface 130. This applies to each of the layers. These substrate processing lanes are disposed approximately in parallel in the vertical direction. In other words, the processing module 120 consists of the substrate processing lanes with the layered structure.

The interface 130 is disposed between the processing module 120 and the exposure machine EXP, and relays the substrate W between them.

For simplifying the description, the cells 121 and 122 will be described by omitting the description of the upper cells. In the cell 121, a carrier space A1 for carrying the substrate W is formed. The carrier space A1 is located in the center of the cell 121, and formed into a strip parallel to the alignment direction of the cells 121 and 122. The treatment units of the cell 121 include coating units 123 that coat the substrates W with a treatment solution, and heat treatment units 124 that perform heat treatment on the substrates W. The coating units 123 are disposed on one side of the carrier space A1. The heat treatment units 124 are disposed on the other side.

The coating units 123 are aligned to face the carrier space A1. The coating units 123 are also aligned in the vertical direction according to this embodiment. For example, the total four coating units 123 are also disposed in two columns and two rows. The coating units 123 include antireflection-film coating units that perform processing for forming an antireflection film on the substrate W, and resist-film coating units that perform processing for forming a resist film on the substrate W. For example, the two coating units 123 in the lower row form the antireflection films on the substrates W, and the two coating units 123 in the upper row form the resist films on the substrates W.

The heat treatment units 124 are aligned to face the carrier space A1. The heat treatment units 124 are also disposed in the vertical direction according to this embodiment. For example, the five heat treatment units 124 can be stacked in the vertical direction to allow the three heat treatment units 124 to be disposed in the horizontal direction. The heat treatment units 124 include respective plates 125 on which the substrates W are mounted. The heat treatment units 124 include cooling units that cool the substrates W, heating and cooling units that continuously perform heating and cooling processes, and adhesion processing units that perform heat treatment in a steam atmosphere containing hexamethyld-isilazane (HMDS) for improving the adhesion between the substrate W and the film. The heating and cooling units include the two plates 125, and a local carrier mechanism whose illustration is omitted and which moves the substrate W between the two plates 125. The number of each of the various heat treatment units is two or more. The heat treatment units are disposed in appropriate positions.

A mounter PASS1 is disposed at the boundary between the indexer 110 and the cell 121. A mounter PASS2 is disposed at the boundary between the cell 121 and the cell 122. The mounter PASS1 relays the substrate W between the indexer 110 and the cell 121, and the mounter PASS2 relays the substrate W between the cell 121 and the cell 122. The mounters PASS1 and PASS2 include a plurality of support pins for supporting the substrates W in the horizontal orientation. The horizontal orientation herein means an orientation in which the thickness direction of the substrate W is equal to the vertical direction. For example, two of the substrates W can be disposed on the mounter PASS1. The mounter PASS1 has, for example, two rows on each of which one substrate W is disposed. The substrate W to be carried from the indexer 110 to the cell 121 is disposed on one of the rows. The substrate W to be carried from the cell 121 to the indexer 110 is disposed on the other row. The mounter PASS2 has also two rows.

The main carrier mechanism T1 is disposed approximately in the center of the carrier space A1. The main carrier mechanism T1 passes the substrates W between the treatment units of the cell 121 and each of the mounters PASS1 and PASS2. In the example of FIG. 1, the main carrier mechanism T1 includes two holding arms H1 and H2. Thus, the main carrier mechanism T1 can remove the substrate W from a target unit (e.g. one of the treatment units of the cell 121) using the holding arm H1, and pass the other substrate W to the target unit using the holding arm H2.

In the cell 122, a carrier space A2 for carrying the substrates W is formed. The carrier space A2 is formed as an extension of the carrier space A1.

The processing units of the cell 122 include coating units 127 that coat the substrates W with a treatment solution, heat treatment units 126 that perform heat treatment on the substrates W, and an edge exposure unit (not illustrated) that exposes light to the perimeters of the substrates W. The coating units 127 are disposed on one side of the carrier space A2. The heat treatment units 126 and the edge exposure unit are disposed on the other side. Here, the coating units 127 are preferably disposed on the same side as the coating units 123. Furthermore, the heat treatment units 126 and the edge exposure unit are preferably disposed on the same side as the heat treatment units 124.

The coating units 127 are also aligned in the vertical direction according to this embodiment. For example, the total six coating units 127 are disposed in three columns and two rows. The coating units 127 include development units that develop the substrates W, and resist-cover-film coating units that perform processing for forming resist cover films on the substrates W. For example, the three coating units 127 in the lower row form the resist cover films on the substrates W, and the three coating units 127 in the upper row develop the substrates W.

The plurality of heat treatment units 126 are aligned in the horizontal direction along the carrier space A2, and stacked in the vertical direction. The heat treatment units 126 include heating units that heat the substrates W, and cooling units that cool the substrates W.

The edge exposure unit is unitary and disposed in a predetermined position. The edge exposure unit includes a rotary holder (not illustrated) that rotatably holds the substrate W, and an illuminator that exposes light to the perimeter of the substrate W held by this rotary holder.

A mounter-buffer P-BF is disposed at the boundary between the cell 122 and the interface 130. The substrate W to be carried from the cell 122 and the interface 130 is disposed on the mounter-buffer P-BF.

The main carrier mechanism T2 is disposed approximately in the center of the carrier space A2 in a planar view. The main carrier mechanism T2 is structured in the same manner as the main carrier mechanism T1. The main carrier mechanism T2 passes the substrates W between the mounter PASS2, the coating units 127, the heat treatment units 126, the edge exposure unit, and the mounter-buffer P-BF.

The interface 130 includes a cleaning block 131 and an ingress/egress block 132. A mounter PASS3 is disposed at the boundary between the cleaning block 131 and the ingress/egress block 132. The mounter PASS3 is structured in the same manner as, for example, the mounters PASS1 and PASS2. A mounter-cooling unit, which is not illustrated, is disposed on the upper side or the lower side of the mounter PASS3. The mounter-cooling unit cools the substrate W to a temperature appropriate for exposing light.

The ingress/egress block 132 includes a carrier mechanism TIF. The carrier mechanism TIF carries the substrate W from the mounter-cooling unit to an ingress LPa of the exposure machine EXP, and carries the substrate W from an egress LPb of the exposure machine EXP to the mounter PASS3.

The cleaning block 131 includes two cleaning and drying units 133a and 133b, and two carrier mechanisms T3a and T3b. The two cleaning and drying units 133a and 133b are disposed to sandwich a pair of the carrier mechanisms T3a and T3b. The cleaning and drying unit 133a cleans and dries the substrates W before exposure. A plurality of the cleaning and drying units 133a may be stacked in multi-rows. The carrier mechanism T3a carries the substrate W from the mounter-buffer P-BF to the cleaning and drying unit 133a, and carries the cleaned and dried substrate W from the cleaning and drying unit 133a to the mounter-cooling unit.

The cleaning and drying unit 133b cleans and dries the substrates W after exposure. A plurality of the cleaning and drying units 133b may be stacked in multi-rows. The carrier mechanism T3b carries the substrate W from the mounter PASS3 to the cleaning and drying unit 133b, and carries the cleaned and dried substrate W from the cleaning and drying unit 133b to the mounter-buffer P-BF.

In such a substrate processing apparatus, the substrate W is processed as follows. Specifically, the substrate W removed from the substrate container C is cooled by the cooling unit of the cell 121. The cooled substrate W is subjected to the coating by the antireflection-film coating unit of the cell 121. Consequently, the antireflection film is formed on the front surface of the substrate W. The substrate W on which the antireflection film is formed is heated and then cooled by the heating and cooling unit. The cooled substrate W is subjected to the coating by the resist-film coating unit. Consequently, the resist film is formed on the front surface of the substrate W. The substrate W on which the resist film is formed is again heated and then cooled by the heating and cooling unit. The substrate W on which the resist film is formed is subjected to the coating by the resist-cover-film coating unit of the cell 122. Consequently, the resist cover film is formed on the front surface of the substrate W. The substrate W on which the resist cover film is formed is heated and then cooled by the heating and cooling unit of the cell 122.

The edge exposure unit of the cell 122 exposes light to the perimeter of the cooled substrate W. The substrate W whose perimeter has been exposed to light is subjected to the cleaning and drying process by the cleaning and drying unit 133a. The mounter-cooling unit cools the cleaned and dried substrate W. The cooled substrate W is exposed to light by the external exposure machine EXP. The substrate W after exposure is subjected to the cleaning and drying process by the cleaning and drying unit 133b. The cleaned and dried substrate W after exposure is subjected to a baking process by the heating and cooling unit of the cell 122. The baked substrate W is cooled by the cooling unit of the cell 122. The cooled substrate W is developed by the development unit. The developed substrate W is heated and then cooled by the heating and cooling unit. The cooled substrate W is carried to the substrate container C in the indexer 110. As such, the substrate processing apparatus performs the processes on the substrate W.

[Substrate Container]

Figure 2:
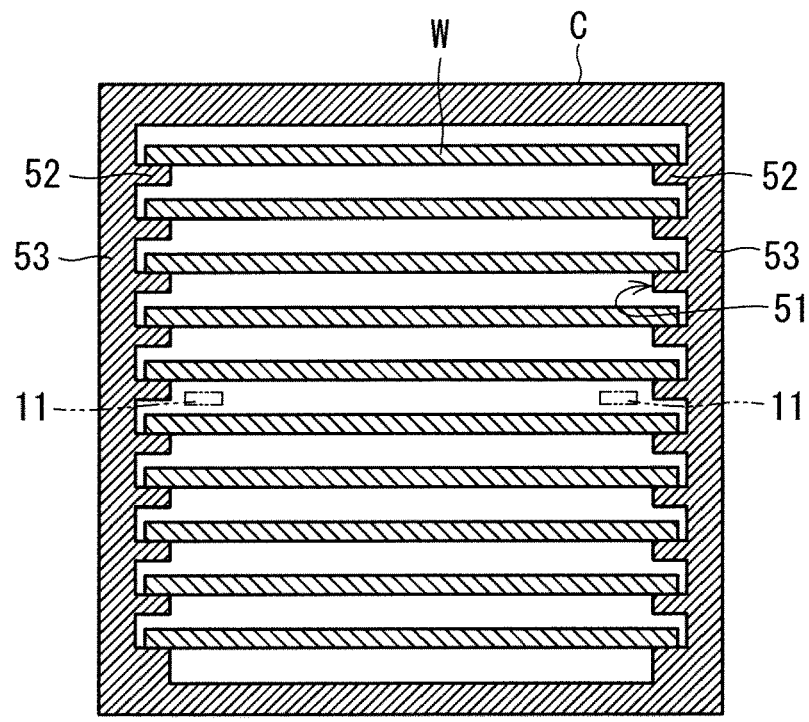
FIG. 2 is a front view schematically illustrating an example structure of a substrate container.
Figure 3:
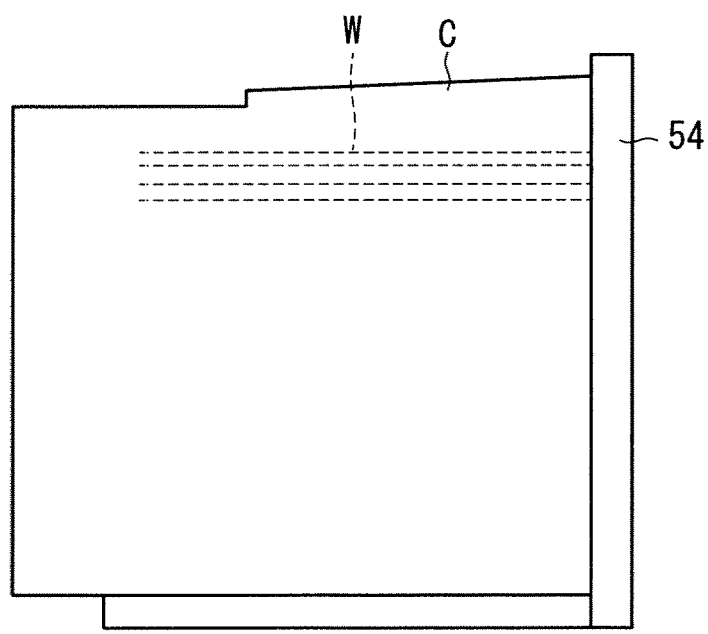
FIG. 3 is a side view schematically illustrating the example structure of the substrate container.

FIG. 2 is a front view schematically illustrating an example structure of the substrate container C. FIG. 3 is a side view illustrating the example structure of the substrate container C. The substrate container C is, for example, shaped like an open box in an approximately horizontal direction (toward the front side of the paper in FIG. 2). The substrate container C is mounted on the container mounting stage 111 so that an opening 51 thereof is directed toward the carrier mechanism TID. The inner sides of facing sidewalls 53 of the substrate container C have protrusion supporters 52 that support the lower surface of each of the substrates W. The protrusion supporter 52 protrudes inward from the inner side of each of the sidewalls 53. The upper surface of the protrusion supporter 52 is approximately horizontal. The protrusion supporters 52 formed on both of the sidewalls 53 support the ends of the substrate W in the horizontal direction. The horizontal direction is a direction in which the sidewalls 53 of the substrate container C face each other.

The protrusion supporters 52 are disposed in the vertical direction with spacings. The plurality of substrates W are supported by the respective left and right protrusion supporters 52. The plurality of substrates W are housed in the substrate container C while being stacked in the vertical direction with spacings.

The example of FIG. 3 illustrates the structure when the substrate container C is a FOUP, and the substrate container C includes a lid 54. The lid 54 opens and closes the opening 51. The indexer 110 includes a driving component for opening and closing the lid 54. When the substrate container C is disposed on the container mounting stage 111, the driving component opens the lid 54. Consequently, the substrate container C is opened toward the carrier mechanism TID.

[Substrate]

Figure 4:
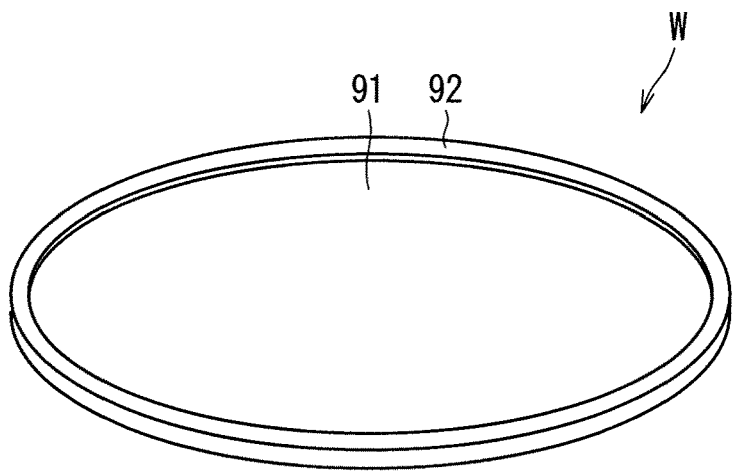
FIG. 4 is a perspective view schematically illustrating an example structure of a substrate.

The substrate W is, for example, a semiconductor wafer and roughly disc-shaped. FIG. 4 is a perspective view schematically illustrating an example structure of the substrate W. As one example of this embodiment, the substrate W includes a central portion 91 and a perimeter 92 that is more external than the central portion 91. The upper surface of the central portion 91 in the substrate W is depressed. Conversely speaking, the substrate W has a shape such that the perimeter 92 protrudes upward relative to the central portion 91. The central portion 91 is approximately circular in a planar view. The perimeter 92 is approximately annular to enclose the central portion 91. The periphery of the central portion 91 is joined to the inner surface of the perimeter 92. The lower surface of the substrate W is approximately flat. Thus, the perimeter 92 of the substrate W is thicker than the central portion 91.

The diameter of the substrate W is, for example, approximately 300 mm. The width of the perimeter 92 (the width in the radial direction) is, for example, approximately 2 to 3 mm. The thickness of the perimeter 92 of the substrate W is, for example, approximately 800 μm. The thickness of the central portion 91 of the substrate W is, for example, approximately 45 to 60 μm.

[Substrate Carrier Apparatus]

Figure 5:
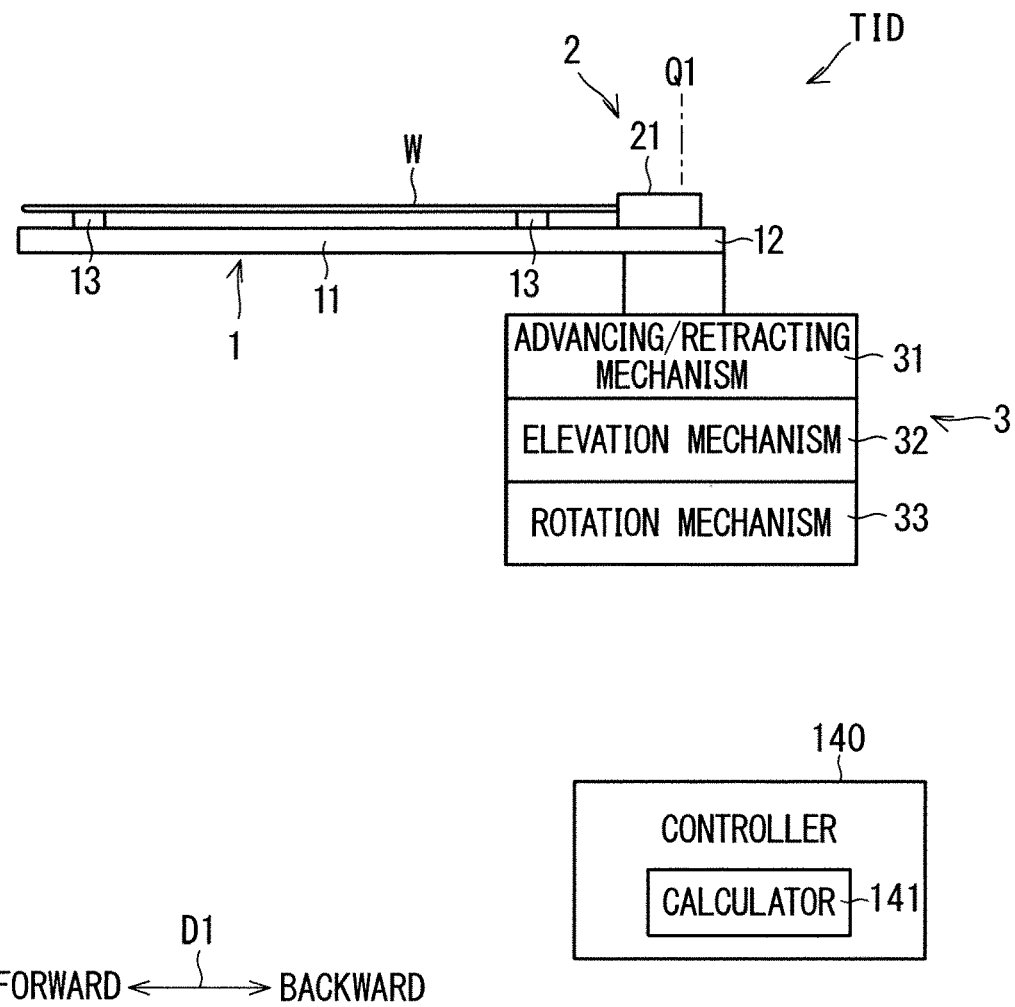
FIG. 5 is a side view schematically illustrating an example structure of a substrate carrier apparatus.
Figure 6:
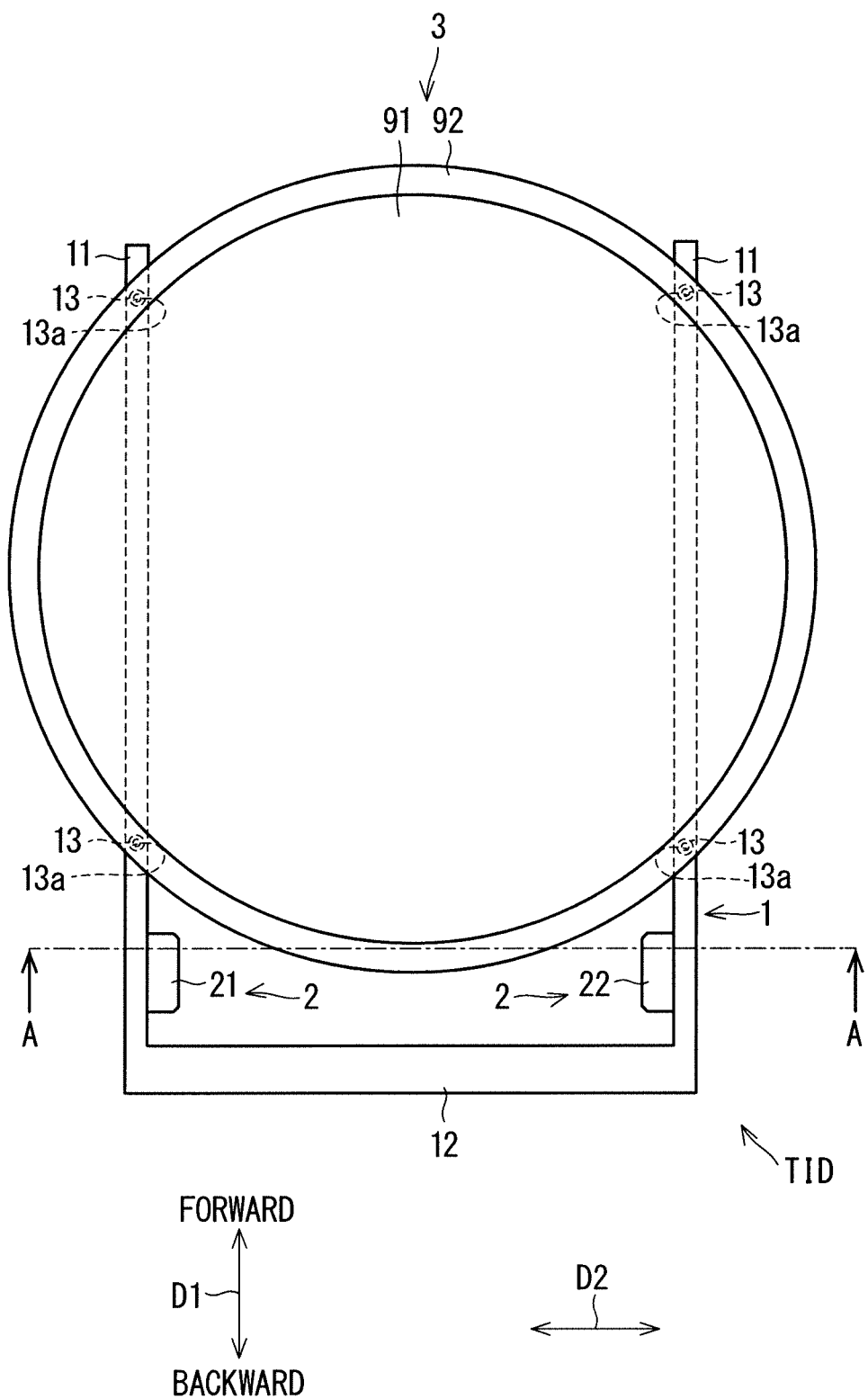
FIG. 6 is a top view schematically illustrating the example structure of the substrate carrier apparatus.

FIG. 5 is a side view illustrating an example structure of the carrier mechanism TID. FIG. 6 is a top view schematically illustrating the example structure of the carrier mechanism TID. The carrier mechanism TID will also be referred to as a substrate carrier apparatus TID hereinafter. The substrate carrier apparatus TID includes a hand 1 that exemplifies a holding arm 13, a sensor (a detector) 2, and a hand movement mechanism 3.

The hand 1 is a component for placing the substrate W. In the example of FIGS. 5 and 6, the hand 1 includes a pair of fingers 11 and a joint component 12. Each of the fingers 11 has an elongated shape. The fingers 11 are disposed approximately in parallel to each other in a planar view (i.e., when viewed along the vertical direction). The upper surfaces of the fingers 11 are approximately horizontal.

The joint component 12 is a component for jointing proximal ends of the fingers 11. In the example of FIGS. 5 and 6, the joint component 12 is shaped like an elongated plate, and disposed so that its thickness direction is equal to the vertical direction. The joint component 12 is, for example, integral with the fingers 11 with the same material. Both ends of the fingers 11 are distant from each other. The hand 1 with such a structure is U-shaped in a planar view.

In the example of FIGS. 5 and 6, two protrusions 13 are formed on each of the upper surfaces of the fingers 11. The protrusions 13 protrude from the upper surfaces of the fingers 11. The protrusions 13 are, for example, approximately circular in a planar view. The total four protrusions 13 formed on the pair of fingers 11 are formed on respective vertexes of virtual rectangles in a planar view. The upper surfaces of the protrusions 13 are approximately horizontal. The substrate W is mounted on the upper surfaces of the protrusions 13. Specifically, the upper surfaces of the protrusions 13 abut the lower surface of the perimeter 92 to support the substrate W.

In the example of FIG. 6, an inlet 13a is formed on each of the upper surfaces of the protrusions 13. At least one of the inlets 13a is formed on each of the protrusions 13. Since the four protrusions 13 are formed in the example of FIG. 6, at least four of the inlets 13a are formed on the hand 1. These inlets 13a are connected to an external suction mechanism (not illustrated) through a suction path inside the hand 1. The suction mechanism converts the pressure in the inlets 13a into a negative pressure, so that the hand 1 can suck the substrate W from below. Consequently, the hand 1 can hold the substrate W.

In the example of FIG. 6, the inlets 13a are immediately below the perimeter 92 of the substrate W. Thus, the hand 1 can exert a suction force on the thick perimeter 92. Consequently, the hand 1 can stably hold the substrate W.

The hand movement mechanism 3 moves the hand 1 at least in a forward and backward direction D1 and the vertical direction. Here, the hand movement mechanism 3 moves the hand 1 in a circumferential direction about a predetermined axis of rotation Q1. As one specific example, the hand movement mechanism 3 includes an advancing/retracting mechanism 31, an elevation mechanism 32, and a rotation mechanism 33. The advancing/retracting mechanism 31 is controlled by the controller 140, and moves the hand 1 in the forward and backward direction D1. The advancing/retracting mechanism 31 may include, for example, a plurality of articulated arms, or may have a ball screw structure. The advancing/retracting mechanism 31 is, for example, coupled to the joint component 12 of the hand 1.

The elevation mechanism 32 is controlled by the controller 140, and moves the hand 1 in the vertical direction. In other words, the elevation mechanism 32 moves the hand 1 up and down. The elevation mechanism 32 has, for example, a ball screw structure. In the example of FIG. 5, the elevation mechanism 32 moves the advancing/retracting mechanism 31 up and down to move the hand 1 up and down.

The rotation mechanism 33 is controlled by the controller 140, and rotates the hand 1 about the axis of rotation Q1 which extends in the vertical direction. Consequently, the hand 1 moves along the circumferential direction about the axis of rotation Q1. The rotation mechanism 33 includes, for example, a motor. In the example of FIG. 5, the rotation mechanism 33 integrally rotates the advancing/retracting mechanism 31, the elevation mechanism 32, and the hand 1. The rotation mechanism 33 rotates the hand 1, so that the orientation of the hand 1 can be changed. Further with reference to FIG. 1, the rotation mechanism 33 moves the hand 1 (the holding arm 13) so that the hand 1 faces the substrate container C or the mounter PASS1.

Since the rotation mechanism 33 rotates the advancing/retracting mechanism 31, the forward and backward direction D1 in which the advancing/retracting mechanism 31 moves the hand 1 is equal to the radial direction about the axis of rotation Q1. The hand 1 is disposed so that the longitudinal direction of the fingers 11 is equal to the forward and backward direction D1.

Here, operations of the substrate carrier apparatus TID when removing the substrate W from the substrate container C will be described in detail. First, the rotation mechanism 33 rotates the vacant hand 1 so that the hand 1 faces the substrate container C. Here, the vacant hand 1 means the hand 1 on which the substrate W is not mounted. Next, the elevation mechanism 32 adjusts the level of the hand 1. Specifically, assuming that the lower surface of the substrate W to be removed (at which the upper surfaces of the left and right protrusion supporters 52 are connected) is a reference level, the elevation mechanism 32 adjusts the level of the hand 1 so that the hand 1 is slightly below the reference level. FIG. 2 illustrates an example level of the fingers 11 using virtual lines. Next, the advancing/retracting mechanism 31 moves the hand 1 forward to a predetermined stop position immediately below the substrate W.

The example of FIG. 6 illustrates the substrate W mounted at a defined reference position in the substrate container C. In other words, FIG. 6 illustrates the substrate W and the hand 1 in an entry state where the hand 1 enters the substrate container C. The example of FIG. 6 illustrates the hand 1 which stops at the predetermined stop position. As exemplified in FIG. 6, when the substrate W is mounted at the defined reference position, the four protrusions 13 of the hand 1 face the lower surface of the perimeter 92 of the substrate W with the hand 1 stopping at the stop position.

Next, the elevation mechanism 32 elevates the hand 1. With this elevation of the hand 1, the protrusions 13 of the hand 1 abut the lower surface of the perimeter 92 of the substrate W to suck the substrate W. Thereby, the hand 1 holds the substrate W. Then, the elevation mechanism 32 slightly elevates the hand 1 to lift the substrate W from the protrusion supporters 52. When the hand 1 lifts the substrate W, the elevation mechanism 32 stops elevating the hand 1. Next, when the advancing/retracting mechanism 31 moves the hand 1 backward, the hand 1 on which the substrate W is mounted is retracted from the substrate container C. As such, the substrate carrier apparatus TID can remove the substrate W from the substrate container C.

When the substrate W is mounted at the reference position in the substrate container C, the protrusions 13 of the hand 1 abut the perimeter 92 of the substrate W. Consequently, the hand 1 can stably hold the substrate W. In contrast, when the mounting position of the substrate W is greatly displaced from the reference position in the forward and backward direction D1, the relative position relationship between the substrate W and the hand 1 is also displaced. For example, the protrusions 13 are off the perimeter 92 of the substrate W, and the hand 1 cannot appropriately hold the substrate W.

Here, the substrate carrier apparatus TID includes the sensor 2 for detecting a position of the substrate W in the forward and backward direction D1. This sensor 2 is movable integrally with the hand 1. In the example of FIGS. 5 and 6, the sensor 2 is disposed on the fingers 11. This sensor 2 is adjacent to the substrate W housed in the substrate container C, in the entry state where the hand 1 enters the substrate container C. Specifically, the sensor 2 faces, in a measurement direction D2, the end of the substrate W in the forward and backward direction D1 in a planar view in a state where the hand 1 stops at the stop position. The measurement direction D2 is a direction intersecting with the forward and backward direction D1, for example, a direction orthogonal to the forward and backward direction D1. In other words, the mounting position of the sensor 2 on the fingers 11 is determined so that the sensor 2 faces the end of the substrate W in the measurement direction D2 in the states above. In the example of FIG. 6, the sensor 2 is disposed closer to (at the rear of) the proximal ends of the fingers 11, and faces the rear end of the substrate W in the measurement direction D2 in a planar view.

The sensor 2 detects a position of the substrate W in the forward and backward direction D1 in the entry state where the hand 1 enters the substrate container C. In other words, the sensor 2 measures the position of the substrate W in the forward and backward direction D1, from the measurement direction D2 intersecting with the forward and backward direction D1. Since the position of the substrate W in the forward and backward direction D1 is easily measured in the measurement direction D2 intersecting with the forward and backward direction D1, the sensor 2 can measure the position of the substrate W in the forward and backward direction D1 with high measurement precision.

In the example of FIGS. 5 and 6, the sensor 2 includes a light emitter 21 and a light receiver 22. The light emitter 21 and the light receiver 22 are disposed to face each other in the measurement direction D2. Specifically, the light emitter 21 and the light receiver 22 are disposed at positions to sandwich the rear end of the substrate W in the measurement direction D2 in the entry state. In other words, the light emitter 21 is disposed opposite to the light receiver 22 with respect to the rear end of the substrate W. In the example of FIG. 6, the light emitter 21 is disposed on one of the pair of the fingers 11, and the light receiver 22 is disposed on the other of the pair of the fingers 11.

The light emitter 21 emits, to the light receiver 22, a stripe of light (i.e., an electromagnetic wave) whose width direction is the forward and backward direction D1. The light emitter 21 includes a light source such as a laser light source or a lamp light source. Since the wavelength of light emitted by the light emitter 21 is not particularly limited, for example, infrared rays are available.

The light receiver 22 receives the light emitted by the light emitter 21, and outputs an electrical signal indicating the amount of received light (hereinafter referred to as a detection signal) to the controller 140. The light receiver 22 is also referred to as a photodetector.

While the vacant hand 1 is outside the substrate container C, the light receiver 22 receives the light emitted by the light emitter 21 as it is. Here, before the elevation of the hand 1 even in a state where the advancing/retracting mechanism 31 causes the hand 1 to enter the substrate container C and stop at a predetermined stop position, the light receiver 22 receives the light from the light emitter 21 as it is. FIG. 7 schematically illustrates an example position relationship between the substrate W and the sensor 2. FIG. 7 schematically illustrates an example cross section taken along the line A-A of FIG. 6. FIG. 7 illustrates, using virtual lines, the sensor 2 when the hand 1 stops at the stop position. In this state, the light emitter 21 and the light receiver 22 are below the substrate W, and the light receiver 22 receives the light emitted by the light emitter 21 without being cut off by the substrate W.

When the elevation mechanism 32 elevates the hand 1, the light emitter 21 and the light receiver 22 are also elevated with the hand 1. As exemplified in FIG. 7, a part of the light from the light emitter 21 will be cut off by the rear end of the substrate W. FIG. 8 is a plan view schematically illustrating an example state where a part of the light from the light emitter 21 is cut off by the substrate W. FIG. 8 illustrates the example state where the substrate W is mounted at a reference position. As clarified from FIG. 8, a front part of the stripe of light from the light emitter 21 is emitted toward the rear end of the substrate W and then cut off by the substrate W, whereas a rear part of the stripe of light proceeds to the light receiver 22 without being cut off by the substrate W. Thus, the light receiver 22 receives the rear part of the stripe of light.

FIG. 9 is a plan view illustrating an example state where the substrate W is disposed at a position displaced rearward from the reference position in the substrate container C. FIG. 9 illustrates, using virtual lines, the substrate W disposed at the reference position. As clarified from a comparison between FIG. 8 and FIG. 9, the amount of light received by the light receiver 22 is changed depending on a position of the substrate W in the forward and backward direction D1. Specifically, as the substrate W is displaced more rearward, the amount of light cut off by the substrate W increases, and the amount of light received by the light receiver 22 decreases.

Here, a calculator 141 of the controller 140 (see FIG. 5) determines a position of the substrate W in the forward and backward direction D1, based on the amount of light received by the light receiver 22. For example, a correspondence between the position of the substrate W in the forward and backward direction D1 and the amount of light received by the light receiver 22 is preset through, for example, a simulation or an experiment. Correspondence information indicating this correspondence is stored in the storage medium of the controller 140 as, for example, a look-up table or a function.

The light receiver 22 outputs, to the controller 140, a detection signal indicating the detected amount of received light. The calculator 141 determines the position of the substrate W in the forward and backward direction D1, based on the amount of received light indicated by the detection signal and the correspondence information stored in the storage medium. Thus, the sensor 2 includes this calculator 141 as well as the light emitter 21 and the light receiver 22.

Although the calculator 141 is included in the controller 140, this calculator 141 may be provided separately from the controller 140. The calculator 141 is an electronic circuit, and may have the same structure as, for example, the controller 140.

The controller 140 determines an adjustment amount of the position of the hand 1 in the forward and backward direction D1, based on the position of the substrate W determined by the calculator 141. Specifically, the controller 140 determines the adjustment amount of the position of the hand 1 so that the four protrusions 13 abut the lower surface of the perimeter 92 of the substrate W. The controller 140 causes the advancing/retracting mechanism 31 to adjust the position of the hand 1 with the adjustment amount. Even when the substrate W is disposed at a position displaced from the defined reference position in the forward and backward direction D1 in the substrate container C, the position of the hand 1 in the forward and backward direction D1 is adjusted according to the displacement of the substrate W. Consequently, the hand 1 can appropriately lift the substrate W.

Since the position of the hand 1 needs to be adjusted before the hand 1 abuts the lower surface of the substrate W, the position of the substrate W needs to be detected before the hand 1 abuts the lower surface of the substrate W. In other words, before the hand 1 abuts the lower surface of the substrate W, a part of the light from the light emitter 21 needs to be cut off by the substrate W. Thus, the light emitter 21 and the light receiver 22 are disposed so that the light emitting surface and the light receiving surface, respectively, are higher than at least the upper surfaces of the protrusions 13 of the hand 1 (i.e., a mount surface on which the substrate W is mounted).

[Removing Operations in Substrate Carrier Apparatus]

Figure 10:
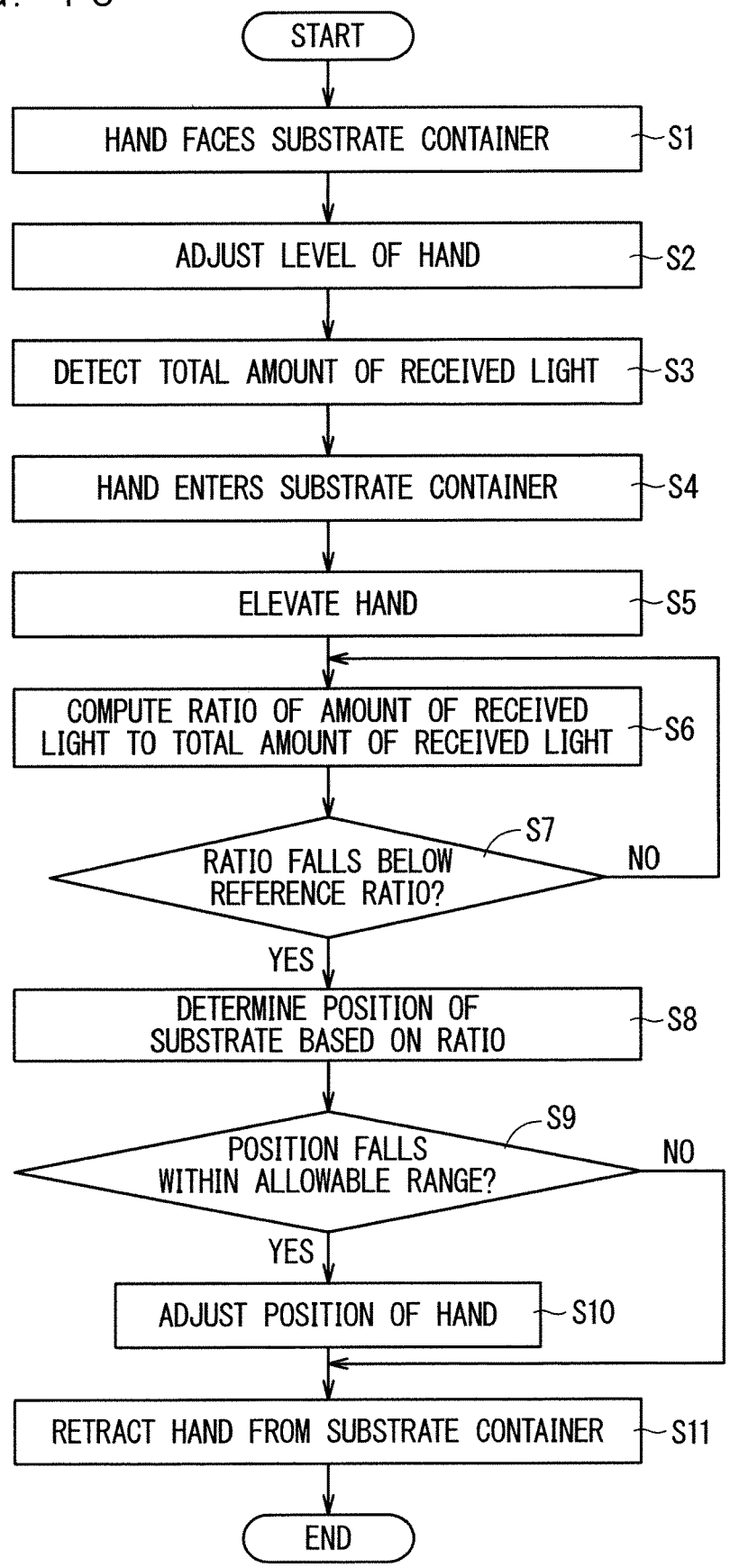
FIG. 10 is a flowchart illustrating example operations of the substrate carrier apparatus.

FIG. 10 is a flowchart illustrating example removing operations from the substrate container C in the substrate carrier apparatus TID. Initially, the substrate W is not disposed on the hand 1 but is outside the substrate container C. First, the rotation mechanism 33 rotates the vacant hand 1 so that the hand 1 faces the substrate container C (step S1). Next, the elevation mechanism 32 adjusts the level of the hand 1 (step S2). Specifically, the elevation mechanism 32 moves the hand 1 to a level slightly below the lower surface of the substrate W to be removed.

Next, the sensor 2 measures the total amount of received light P1 (step S3). The total amount of received light P1 is an amount of light received by the light receiver 22 without the light emitted from the light emitter 21 of the sensor 2 being cut off by the substrate W. As the specific operations, the controller 140 first instructs the light emitter 21 to emit light. Then, the light emitter 21 emits light according to the instruction. The light receiver 22 receives the light, and outputs, to the controller 140, a detection signal indicating the amount of received light. Here, the light receiver 22 receives the light emitted by the light emitter 21 as it is. The controller 140 stores this amount of received light as the total amount of received light P1 in the storage medium.

Next, the advancing/retracting mechanism 31 moves the hand 1 forward to stop the hand 1 at a predetermined stop position (step S4). The hand 1 enters the substrate container C at this predetermined stop position, and the light emitter 21 is disposed opposite to the light receiver 22 with respect to the rear end of the substrate W in a planar view (see FIGS. 8 and 9). Here, the light from the light emitter 21 is not yet cut off by the substrate W before the hand 1 is elevated (see the virtual lines in FIG. 7). In this case, detection of the total amount of received light P1 (step S3) may be performed while the hand 1 stops at the stop position. In other words, step S3 may be performed after step S4.

Next, the elevation mechanism 32 elevates the hand 1 (step S5). Since the sensor 2 moves integrally with the hand 1, the sensor 2 is also elevated. Next, the calculator 141 computes a ratio R1 of an amount of light P2 received by the light receiver 22 to the total amount of received light P1 (=P2/P1), based on the detection signal received from the light receiver 22 (step S6). When the light from the light emitter 21 is not cut off by the substrate W, the ratio R1 is ideally 1.0. With the elevation of the sensor 2, a part of the light from the light emitter 21 will be cut off by the substrate W (see FIGS. 8 and 9). The amount of light P2 received by the light receiver 22 greatly decreases. Here, the amount of light P2 is changed by a first predetermined value or higher. In other words, the ratio R1 decreases by a second predetermined value or higher.

The calculator 141 determines whether the ratio R1 falls below a predetermined reference ratio smaller than 1.0 (step S7). This reference ratio is preset and stored in the storage medium of the controller 140. This reference ratio is a value smaller than 1.0, and larger in value than the amount of light received by the light receiver 22 when the substrate W is in the forward-most position in the substrate container C. This reference ratio is a value obtained by subtracting the second predetermined value from 1.0.

The ratio R1 is ideally 1.0 while the light from the light emitter 21 is not yet cut off by the substrate W. Thus, the calculator 141 repeatedly executes a pair of steps S6 and S7. When the light from the light emitter 21 is cut off by the substrate W with the elevation of the sensor 2, the ratio R1 becomes lower than the reference ratio. When the ratio R1 is smaller than the reference ratio, the calculator 141 determines a position of the substrate W in the forward and backward direction D1 based on the ratio R1 (step S8). For example, a correspondence between the ratio R1 and the position of the substrate W in the forward and backward direction D1 is preset through, for example, a simulation or an experiment. Correspondence information indicating this correspondence is stored in the storage medium as, for example, a look-up table or a function. The calculator 141 determines the position of the substrate W in the forward and backward direction D1, based on the determined ratio R1 and the correspondence information stored in the storage medium.

Next, the controller 140 determines whether the determined position of the substrate W falls within an allowable range (step S9). The allowable range is an allowable range of the position of the substrate W in the forward and backward direction D1. When the determined position of the substrate W falls within this allowable range, the hand 1 can lift the substrate W at an appropriate position by elevating the hand 1 through the elevation mechanism 32.

When the position of the substrate W falls outside the allowable range, the controller 140 computes an adjustment amount of the position of the hand 1, based on a comparison between the position of the substrate W and the reference position of the substrate W. The controller 140 causes the advancing/retracting mechanism 31 to adjust the position of the hand 1 in the forward and backward direction D1 with the adjustment amount (step S10). Specifically, the controller 140 computes, as the adjustment amount, a difference between the determined position of the substrate W and the reference position of the substrate W. The reference position of the substrate W is, for example, stored in the storage medium of the controller 140.

When the position of the hand 1 in the forward and backward direction D1 is adjusted, the elevation mechanism 32 may suspend the elevation of the hand 1. After the advancing/retracting mechanism 31 adjusts the position of the hand 1, the elevation mechanism 32 elevates the hand 1 again.

When the position of the substrate W determined by the calculator 141 falls within the allowable range, the elevation mechanism 32 continues to elevate the hand 1 without execution of step S10.

When the hand 1 lifts the substrate W, the elevation mechanism 32 stops elevating the hand 1. Next, the advancing/retracting mechanism 31 moves the hand 1 backward to retract the hand 1 from the substrate container C (step S11).

As described above, the substrate carrier apparatus TID detects the position of the substrate W in the forward and backward direction D1 using the sensor 2 during the operation of removing the substrate W. Then, the substrate carrier apparatus TID moves, according to the detected position, the hand 1 to an appropriate position with respect to the substrate W, and then elevates the hand 1. Thus, even with the displacement of the substrate W in the forward and backward direction D1 in the substrate container C, the substrate carrier apparatus TID can appropriately remove the substrate W.

Moreover, the light emitter 21 and the light receiver 22 that are simplified can detect the position of the substrate W in the forward and backward direction D1 in the aforementioned example.

In the example, the substrate W includes the thin central portion 91 and the thick perimeter 92 whose supporting area is narrow. Thus, the displacement tolerance between the substrate W and the hand 1 in the forward and backward direction D1 is small. Consequently, the substrate carrier apparatus TID capable of detecting the position of the substrate W and adjusting the position of the hand 1 is particularly useful for the substrate W including the central portion 91 and the perimeter 92.

[Levels of Light Emitter and Light Receiver]

In the example of FIG. 7, the light emitter 21 and the light receiver 22 are disposed at different levels. Although the light emitter 21 is higher than the light receiver 22 in the example of FIG. 7, they may be disposed at the same level.

[Deflection of Substrate]

The protrusion supporters 52 support both ends of the substrate W in the horizontal direction in the substrate container C. Thus, the substrate W deflects via the ends under its own weight. FIG. 11 schematically illustrates an example shape of the substrate W housed in the substrate container C. In the example of FIG. 11, the substrate W deflects so that its central portion is lower than its ends. In other words, the substrate W deflects downward to a convex shape. Since only the ends of the substrate W are supported in the substrate container C, the substrate W deflects in the cross section when viewed from the forward and backward direction D1 (FIG. 11) but hardly deflects in a cross section when viewed from the horizontal direction.

FIG. 11 also illustrates the sensor 2. According to this embodiment, the light from the light emitter 21 is not yet cut off by the substrate W before the hand 1 and the sensor 2 is elevated. In other words, the light from the light emitter 21 proceeds below the substrate W and enters the light receiver 22 as it is. As the hand 1 and the sensor 2 are elevated, the light from the light emitter 21 will start to be cut off by the substrate W. The larger an amount of deflection of the substrate W is, the lower the level of the light emitter 21 when the light starts to be cut off by the substrate W is. In other words, the larger the amount of deflection of the substrate W is, the lower the level of the hand 1 when the amount of received light is greatly changed is. To put it differently, the larger the amount of deflection of the substrate W is, the lower the level of the hand 1 when the ratio R1 is changed from 1.0 to a value smaller than a reference ratio is. A correspondence between the level of the hand 1 and the amount of deflection of the substrate W can be preset through, for example, a simulation or an experiment. Thus, correspondence information indicating the correspondence between the level and the amount of deflection is prestored in the storage medium of the controller 140.

Figure 12:
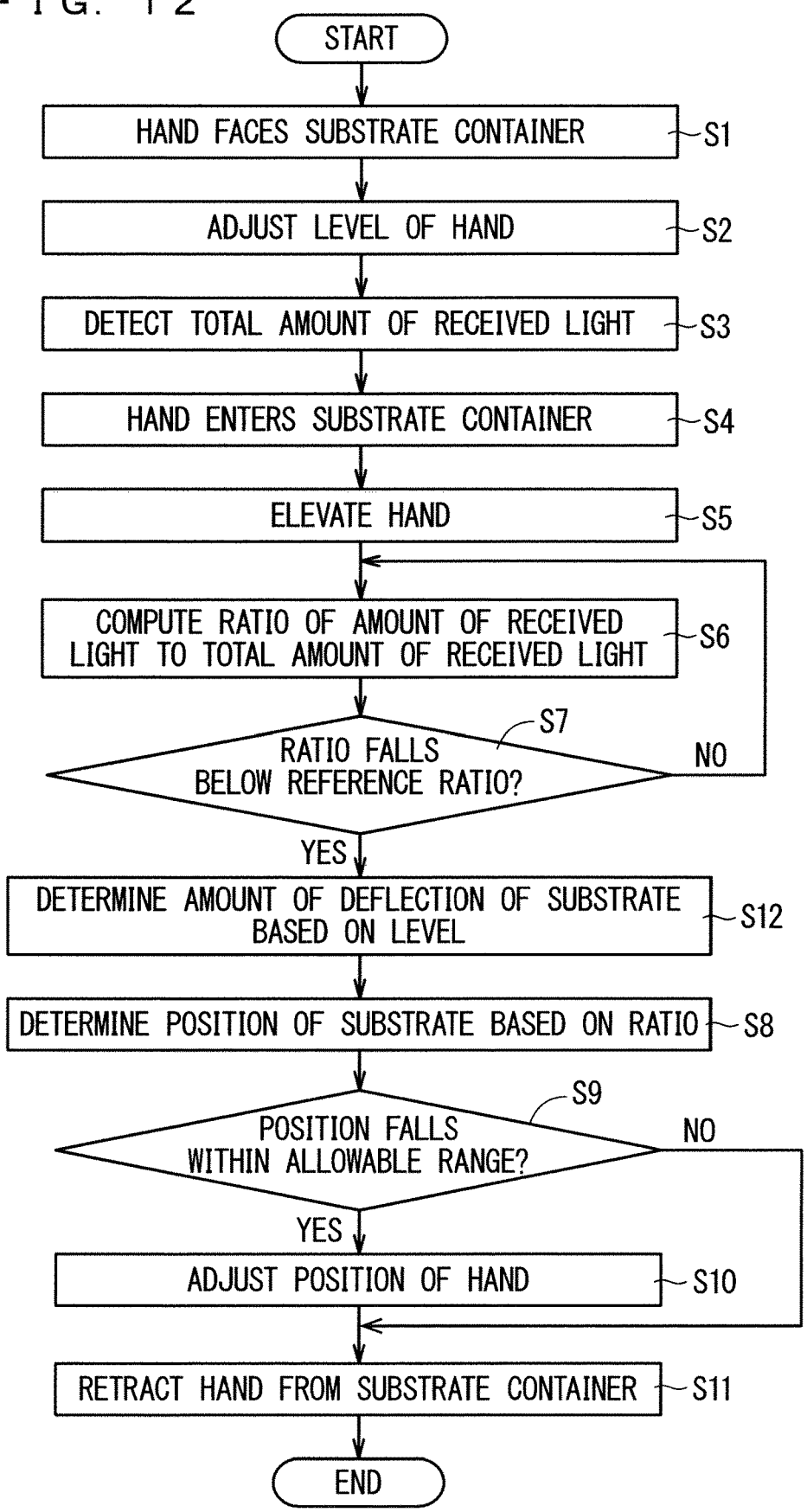
FIG. 12 is a flowchart illustrating another example of the operations of the substrate carrier apparatus.

The calculator 141 monitors the level of the hand 1 when the amount of received light P2 is greatly changed upon elevation of the hand 1 and the sensor 2, and determines the amount of deflection of the substrate W, based on a difference (distance) between the level and a reference level. FIG. 12 is a flowchart illustrating example operations of the substrate carrier apparatus TID. FIG. 12 includes step S12 in addition to the flowchart in FIG. 10. In the example of FIG. 12, the calculator 141 performs step S12 when determining in step S7 that the ratio R1 is smaller than the reference ratio. In step S12, the calculator 141 determines the amount of deflection of the substrate W, based on the level of the hand 1. The level of the hand 1 is determined, for example, based on an elapsed time from the start of the elevation of the hand 1 and the sensor 2, and the elevation speed. Alternatively, a sensor for detecting the level of the hand 1 may be provided. For example, when the elevation mechanism 32 includes a motor, the sensor may be an encoder that detects a rotational position of the motor. The calculator 141 determines the amount of deflection of the substrate W, based on the determined level and the correspondence information stored in the storage medium.

Then, the substrate carrier apparatus TID removes the substrate W through steps S8 to S11.

As described above, the substrate carrier apparatus TID can detect the amount of deflection of the substrate W when removing the substrate W from the substrate container C. Thus, the substrate carrier apparatus TID can detect the amount of deflection of the substrate W with low cost, without separately providing a dedicated detector that detects the amount of deflection.

[Passing to Substrate Holder]

In the example of FIG. 6, the hand 1 is U-shaped in a planar view, and supports the perimeter 92 of the substrate W. Thus, the vicinity of the center of the substrate W does not face the hand 1, and the substrate W may deflect under its own weight even while being disposed on the hand 1. Although the amount of deflection of the substrate W on the hand 1 may be different from that in the substrate container C, the larger the amount of deflection of the substrate W in the substrate container C is, the larger the amount of deflection of the substrate W on the hand 1 will be. In other words, when the amount of deflection of the substrate W in the substrate container C is larger, the substrate W is relatively prone to deflection. Thus, the substrate W greatly deflects on the hand 1.

A correspondence between the amount of deflection of the substrate W in the substrate container C and the amount of deflection of the substrate W on the hand 1 can also be preset through, for example, a simulation or an experiment. Correspondence information indicating this correspondence is also stored in the storage medium of the controller 140 as, for example, a look-up table or a function. Thus, the calculator 141 can also determine the amount of deflection of the substrate W on the hand 1, based on the amount of deflection of the substrate W in the substrate container C. In other words, the calculator 141 can determine the amount of deflection of the substrate W on the hand 1, based on the level of the hand 1 when the amount of received light is greatly changed.

When the substrate carrier apparatus TID passes the substrate W to the mounter PASS1, the hand 1 is lowered so that the substrate W is disposed on the substrate holder of the mounter PASS1. The substrate holder includes, for example, the plurality of support pins which support the lower surface of the substrate W. The support pins support, for example, at least the lower surface of the central portion 91 of the substrate W. In this passing, as the amount of deflection of the substrate W is larger, the lower surface of the substrate W abuts the substrate holder (the support pins) at a higher position.

When the substrate W is disposed on the substrate holder, the lowering speed of the hand 1 is preferably less for reducing the impact. Conversely, the lowering speed is preferably higher for improving the throughput. Thus, it is preferred to increase the lowering speed of the hand 1 until the abutment of the substrate W to the substrate holder and to set the lowering speed less upon abutment of the substrate W to the substrate holder.

Figure 13:
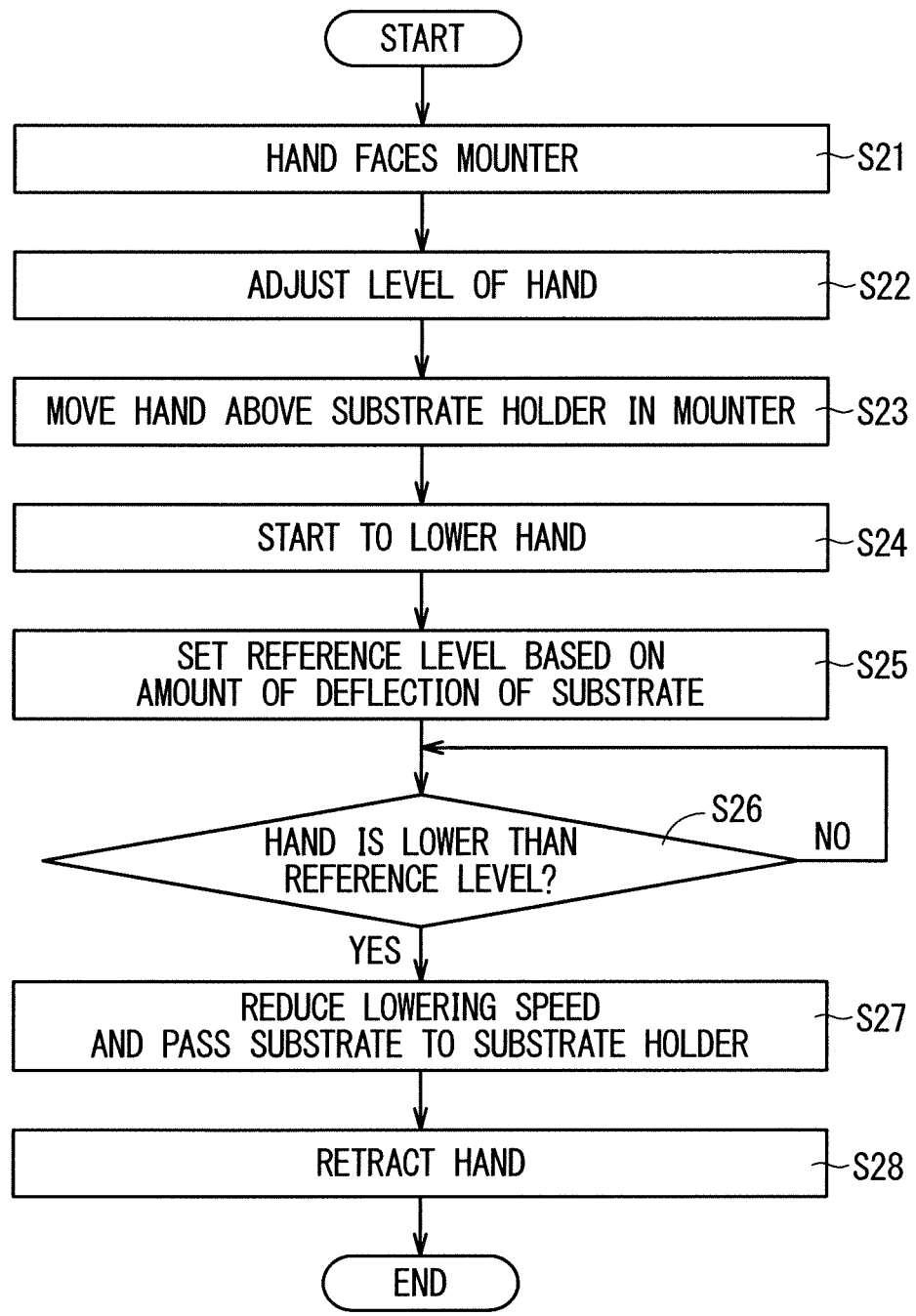
FIG. 13 is a flowchart illustrating example operations of the substrate carrier apparatus.

Thereby, the controller 140 determines the lowering speed of the hand 1 when the substrate W is passed to the mounter PASS1, based on the amount of deflection of the substrate W on the hand 1. FIG. 13 is a flowchart illustrating example operations of the substrate carrier apparatus TID. FIG. 13 illustrates example operations of passing the substrate W to the mounter PASS1. The substrate W is disposed on the hand 1. First, the rotation mechanism 33 rotates the hand 1 so that the hand 1 faces the mounter PASS1 (step S21). Next, the elevation mechanism 32 moves the hand 1 to a preset level (step S22). Next, the advancing/retracting mechanism 31 moves the hand 1 forward to stop the hand 1 at a position higher than the substrate holder of the mounter PASS1 (step S23). The position is, for example, preset.

Next, the elevation mechanism 32 starts to lower the hand 1 (step S24). Consequently, the lowering speed of the hand 1 is increased to a target value. Next, the controller 140 sets a reference level based on the amount of deflection of the substrate W on the hand 1 (step S25). This reference level is set higher as the amount of deflection of the substrate W is larger. A correspondence between the reference level and the amount of deflection of the substrate W is preset through, for example, a simulation or an experiment. Correspondence information indicating this correspondence is stored in the storage medium of the controller 140 as, for example, a look-up table or a function. The controller 140 sets the reference level based on the amount of deflection of the substrate W and the correspondence information stored in the storage medium.

Next, the controller 140 determines whether the current level of the hand 1 is lower than the reference level (step S26). The reference level should be set before this determination process, or may be set before the hand 1 is lowered (step S24).

The controller 140 computes the level of the hand 1 based on, for example, an elapsed time from the start of the lowering of the hand 1 and the lowering speed. The controller 140 compares this level with the reference level. When the level is yet higher than or equal to the reference level, the controller 140 executes step S26 again.

When the level is lower than the reference level, the elevation mechanism 32 reduces the lowering speed (step S27). Consequently, when the amount of deflection of the substrate W is larger, the elevation mechanism 32 can start to reduce the lowering speed from a higher position. Thus, the substrate W can be passed to the substrate holder of the mounter PASS1 with the lowering speed sufficiently reduced.

Furthermore, the elevation mechanism 32 can lower the hand 1 at a greater lowering speed until the level of the hand 1 is reduced to the reference level. Thus, the substrate W can be passed to the substrate holder of the mounter PASS1 with higher throughput.

When the substrate W is mounted on the substrate holder (the support pins), the elevation mechanism 32 stops lowering the vacant hand 1, and the advancing/retracting mechanism 31 retracts the hand 1 from the mounter PASS1 (step S28).

As described above, the elevation mechanism 32 can reduce the lowering speed of the hand 1 from a higher level when the amount of deflection is larger, and reduce the lowering speed of the hand 1 from a lower level when the amount of deflection is smaller. Consequently, the elevation mechanism 32 can sufficiently decrease the lowering speed until abutment of the substrate W to the substrate mounter, and lower the hand 1 at a greater lowering speed up to the level. Thus, the substrate carrier apparatus TID can pass the substrate W to the substrate holder of the mounter PASS1 with higher throughput, and reduce the lowering speed upon mounting of the substrate W on the substrate holder.

While the embodiments have been described hereinabove, the substrate carrier apparatus can be variously modified without departing from the scope of the disclosure. Within the scope of the disclosure, the embodiments can be freely combined, and any consistent elements in the embodiments can be modified or omitted.

In the specific examples, the sensor 2 is disposed closer to the proximal ends (the rear ends) of the fingers 11 of the hand 1. However, the sensor 2 may be disposed closer to the tips (the forward side) of the fingers 11 of the hand 1. In other words, the sensor 2 may be disposed at positions facing the front end of the substrate W in the measurement direction D2, in the entry state where the hand 1 enters the substrate container C.

In the specific examples above, the sensor 2 is disposed on the fingers 11 of the hand 1. However, the position of the sensor 2 is not necessarily limited to these. For example, when the other components are joined to the fingers 11 and the joint component 12, the sensor 2 may be joined to the other components.

In the examples above, the hand 1 is elevated from the level at which the light from the light emitter 21 is not cut off by the substrate W for determining the amount of deflection of the substrate W. However, the level is not necessarily limited to this when there is no need to determine the amount of deflection of the substrate W. For example, the hand 1 may enter the substrate container C at the level at which the light from the light emitter 21 is cut off by the substrate W. Here, the sensor 2 can detect the position of the substrate W in the forward and backward direction D1 while the hand 1 stops at the stop position in the substrate container C.

Furthermore, the substrate carrier apparatus TID adjusts the lowering speed of the hand 1 according to the amount of deflection of the substrate W when placing the substrate W on the mounter PASS1 in the examples above. However, this adjustment of the lowering speed is not limited to the case where the substrate W is disposed on the mounter PASS1. For example, the substrate holder for holding the substrate W is disposed in each of the treatment units of the processing module 120. The substrate holder may include, for example, a substrate mounter which is shaped like a plate and includes an inlet for sucking the lower surface of the substrate W, and a lift pin for elevating and lowering the substrate W. The substrate mounter abuts at least the vicinity of the center of the lower surface of the substrate W. While the lift pin is elevated, the lift pin supports the substrate W above the substrate mounter. When the substrate W is carried in, the main carrier mechanism T1 or the main carrier mechanism T2 places the substrate W on the lift pin which is being elevated. The lift pin is lowered while supporting the substrate W, and is mounted on the substrate mounter. Here, the lowering speed of the lift pin may be adjusted according to the amount of deflection of the substrate W. A correspondence between the amount of deflection of the substrate W on the lift pin and the amount of deflection of the substrate W on the hand 1 can be preset through, for example, a simulation or an experiment. As the amount of deflection of the substrate W is larger, the lift pin starts to be lowered from a higher position with the less lowering speed. Accordingly, the substrate W can be passed to the substrate mounter with higher throughput, while the lowering speed when the substrate W is passed to the substrate mounter can be reduced.

What is claimed is:

1. A substrate carrier apparatus that removes a substrate from a substrate container and carries the substrate to a substrate holder, the substrate container having an inner structure for housing a plurality of substrates in a horizontal orientation with the plurality of substrates stacked in a vertical direction with spacings, the substrate carrier apparatus comprising:
    a hand;
    an advancing/retracting mechanism that moves the hand in a forward and backward direction to cause the hand to enter and be retracted from the substrate container;
    an elevation mechanism that elevates the hand so that the hand lifts the substrate from below;
    a movement mechanism that moves the hand to a position facing the substrate container; and
    a detector that detects a position of the substrate in the forward and backward direction in an entry state where the advancing/retracting mechanism causes the hand to enter the substrate container, the detector moving integrally with the hand and being disposed at a position adjacent to the substrate in a measurement direction intersecting with the forward and backward direction, wherein the detector includes:
    a light emitter and a light receiver disposed to face each other in the measurement direction; and
    a calculator,
    the light emitter emits, to the light receiver, a stripe of light whose width direction is the forward and backward direction, and
    the calculator determines the position of the substrate in the forward and backward direction, based on a ratio of an amount of a second received light to a first received light,
    the amount of the first received light is the amount of light received by the light receiver in a state where the light from the light emitter is not cut off by the substrate, and
    the amount of the second received light is the amount of light received by the light receiver in the entry state.

2. The substrate carrier apparatus according to claim 1, further comprising:
    a storage medium that stores a reference position of the substrate in the substrate container in the forward and backward direction; and a controller that causes the advancing/retracting mechanism to adjust a position of the hand in the entry state in the forward and backward direction, based on a comparison between the position of the substrate in the forward and backward direction and the reference position stored in the storage medium, the position of the substrate being detected by the detectors.

3. The substrate carrier apparatus according to claim 1, wherein the detector is disposed higher than a mount surface of the hand on which the substrate is mounted.

4. The substrate carrier apparatus according to claim 1, wherein at least two inlets are formed on the hand.

5. A method for carrying a substrate using the substrate carrier apparatus according to claim 1, the method comprising the steps of:

supporting both ends of the substrate in the substrate container, in a horizontal direction orthogonal to the forward and backward direction;

elevating, in the entry state, the hand from a level at which the light emitted from the light emitter is not cut off by the substrate, the elevating being performed by the elevation mechanism; and determining an amount of deflection of the substrate based on a position of the hand when the amount of the light received by the light receiver is changed by a predetermined value or higher during the elevating of the hand, the determining being performed by the calculator.

6. The method according to claim 5, further comprising:

a first step of moving the hand supporting the substrate above the substrate holder, the first step being performed by the advancing/retracting mechanism; and a step of lowering the hand for passing the substrate to the substrate holder after the first step, and reducing a lowering speed of the hand from a level based on the amount of deflection of the substrate determined by the calculator, the lowering and the reducing being performed by the elevation mechanism.

* * * * *